US006751323B2

(12) United States Patent
Poldy

(10) Patent No.: US 6,751,323 B2
(45) Date of Patent: Jun. 15, 2004

(54) ELECTROACOUSTIC APPARATUS HAVING RINGING SIGNAL GENERATION MEANS CAPABLE OF PRODUCING A SUBJECTIVE BASS PERCEPTION

(75) Inventor: Carl Poldy, Vienna (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 365 days.

(21) Appl. No.: 10/015,842

(22) Filed: Dec. 10, 2001

(65) Prior Publication Data

US 2002/0071548 A1 Jun. 13, 2002

(30) Foreign Application Priority Data

Dec. 13, 2000 (EP) ........................................ 00890371

(51) Int. Cl.[7] ........................ H03G 5/00; H04M 3/00

(52) U.S. Cl. ............... 381/101; 333/28 T; 379/375.01; 379/418

(58) Field of Search ......................... 381/101, 98, 102, 381/103; 379/207.16, 375.01, 386, 418; 333/28 T; 455/267; 84/622, 659

(56) References Cited

U.S. PATENT DOCUMENTS 4,284,965 A * 8/1981 Higashi et al. ........... 333/28 T
4,386,239 A * 5/1983 Chien ......................... 379/386
4,438,414 A * 3/1984 Blachot ..................... 333/28 T
4,972,466 A * 11/1990 Quesnel et al. ........ 379/375.01
4,994,770 A * 2/1991 Niwayama ................ 333/28 T
6,381,330 B1 * 4/2002 Johanson .................... 379/386

FOREIGN PATENT DOCUMENTS

JP 358080911 A * 5/1983 ................ 381/101

* cited by examiner

*Primary Examiner*—Xu Mei
(74) *Attorney, Agent, or Firm*—Peter Zawilski

(57) ABSTRACT

An electroacoustic transducer (1) includes a ringing signal generation means (20) for generating a ringing signal (CS) and an electroacoustic transducer (9) for the acoustic reproduction of the ringing signal (CS), in which the ringing signal generation means (20) includes at least two fundamental tone signal generation stages (GT1, GT2, . . . GTn), which are each adapted to generate a fundamental tone signal (GS1, GS2, . . . GSn) of a given frequency (f1, f2, . . . fn), which frequencies (f1, f2 . . . fn) are in a rational ratio to each other, and in which the ringing signal generation means (20) has a control means (21) with the aid of which each of the fundamental tone signal generation stages (GT1, GT2, . . . GTn) can be activated for a given time interval, namely in such a manner that at least two fundamental tone signal generation stages (GT1, GT2, . . . GTn) are activated simultaneously.

5 Claims, 1 Drawing Sheet

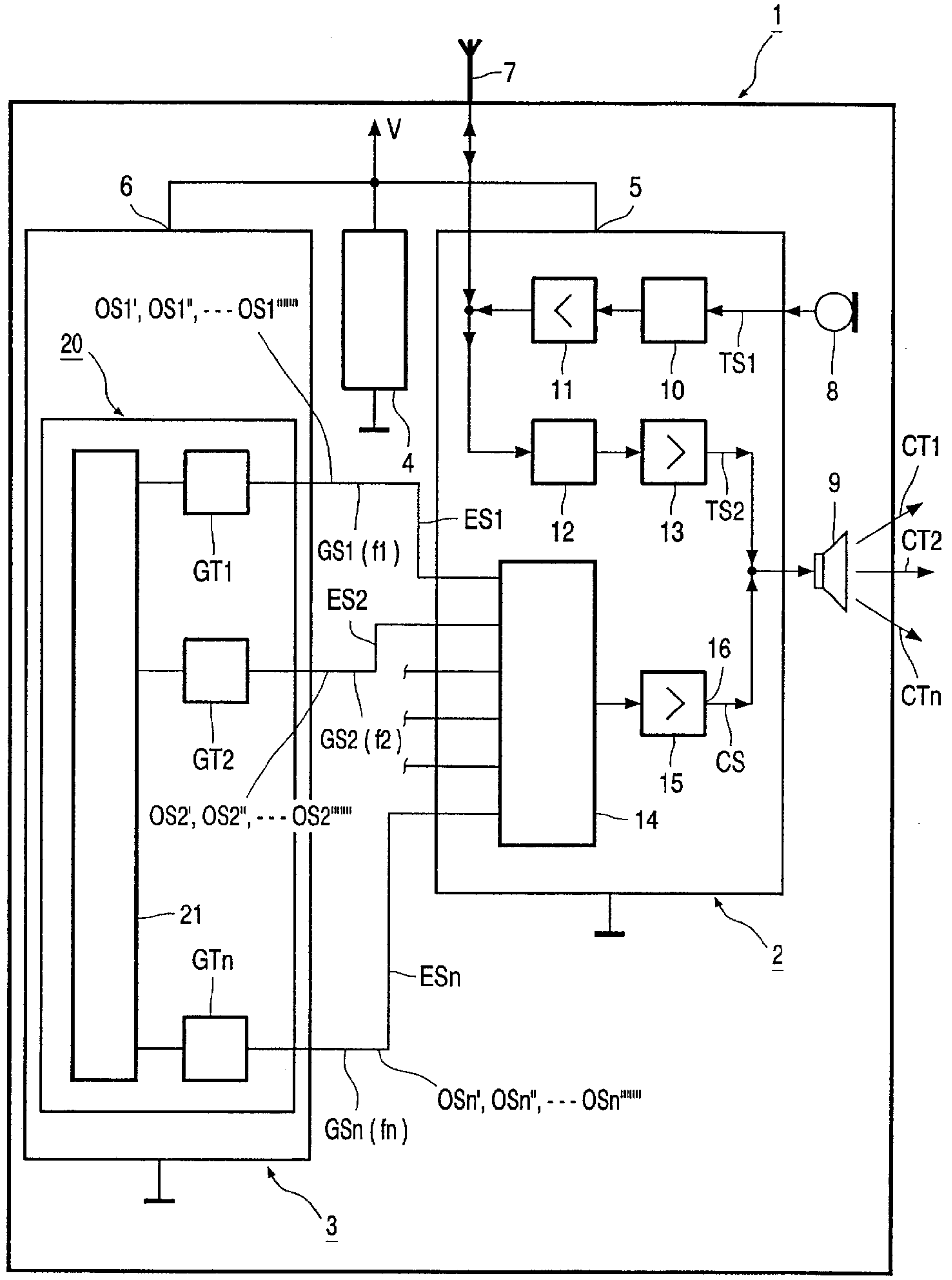
1
7
V
6
5
OS1', OS1", - - - OS1""""
20
11
10
TS1
8
4
12
13
TS2
CT1
9
CT2
GT1
GS1 ( f1 )
ES1
ES2
16
CTn
GT2
GS2 ( f2 )
15
CS
OS2', OS2", - - - OS2""""
14
21
2
GTn
ESn
OSn', OSn", - - - OSn""""
GSn ( fn )
3

ELECTROACOUSTIC APPARATUS HAVING RINGING SIGNAL GENERATION MEANS CAPABLE OF PRODUCING A SUBJECTIVE BASS PERCEPTION

BACKGROUND OF THE INVENTION

The invention relates to an electroacoustic apparatus having ringing signal generation means for generating a ringing signal composed of a combination of constituent signals and having an electroacoustic transducer which reproduces the ringing signal as a combination of ringing tones produced by the constituent signals.

An electroacoustic apparatus of the type defined hereinbefore has been put on the market as a so-called mobile telephone in a multitude of variants and is consequently known. In the known apparatus the constituent signals and, consequently, the ringing tones are always generated time sequentially, as a result of which the temporal sequence of ringing tones forms a combination of ringing tones, which combination of ringing tones forms a ringing event by means of which a user of the known apparatus is informed of an incoming call. The frequencies of the time-sequentially generated ringing tones correspond to a so-called piano scale. In other words, this means that the frequencies of the constituent signals, which are generated with the aid of the ringing signal generation means in order to generate the individual ringing tones and which in succession form the ringing signal, bear an irrational ratio to each other. For example, a first constituent signal may have a frequency f1=440.00 Hz, a second constituent signal may have a frequency of approximately f2=554.37 Hz, a third constituent signal may have a frequency of approximately f3=659.26 Hz and a fourth constituent signal may have a frequency of approximately f4=783.99 Hz. In the known apparatus this frequency relationship and the fact that always only constituent signals and, consequently, individual ringing tones are reproduced in temporal sequence result in a lowest frequency f1=440.00 Hz for the combination of reproduced ringing tones. During the acoustic reproduction of the combination of ringing tones, i.e. of the ringing event, this results in a tinny and cheap sound impression, which is not perceived as particularly attractive and pleasant by many users of the known apparatus.

SUMMARY OF THE INVENTION

It is an object of the invention to realize an improved apparatus of the type defined in the first paragraph with the aid of simple means and substantially without any additional means.

In order to achieve this object, characteristic features in accordance with the invention are provided in an electroacoustic apparatus in accordance with the invention, in such a manner that an electroacoustic apparatus in accordance with the invention can be characterized in the manner defined hereinafter, namely:

An electroacoustic transducer having ringing signal generation means for generating a ringing signal composed of a combination of constituent signals, and having an electroacoustic transducer, to which the ringing signal can be applied and which reproduces the ringing signal as a combination of ringing tones produced by the constituent signals, in which the ringing signal generation means include at least two fundamental tone signal generation means, which are each adapted to generate a fundamental tone signal of a given frequency, and in which the ringing signal generation means further include control means which serve for controllably activating the fundamental tone signal generation means and with the aid of which the fundamental tone signal generation means can be activated for a given time interval, and in which the fundamental tone signal generation means are adapted to generate fundamental tone signals of frequencies which are in a rational ratio to each other, and in which the control means are realized so as to cause a simultaneous activation of at least two fundamental tone signal generation means within a given time interval.

As a result of the provision of characteristic features in accordance with the invention it is achieved in a simple manner and substantially without any additional means that with the aid of the ringing signal generation means at least two constituent signals can be generated at the same time within a given time interval and, consequently, at least two ringing tones can be reproduced at the same time with the aid of the electroacoustic apparatus in accordance with the invention, as a result of which, owing to the fact that the frequencies of the constituent signals and, as a consequence, of the concurrent ringing tones bear a rational ratio to each other, a user perceives not only the at least two concurrent ringing tones but also at least one tone of a low frequency corresponding to the difference of the frequencies of the at least two concurrent ringing tones. Thus, it is achieved that a user of an electroacoustic apparatus in accordance with the invention not only hears the combination of ringing tones actually produced with the aid of the ringing signal generation means and of the electroacoustic transducer, which tones have comparatively high frequencies for ringing tones and lie in a frequency range between, for example, 440 Hz and, for example, 6 kHz, but also experiences a subjective bass perception, which on account of the subjective perception of ringing tones of lower frequencies results in the overall perception of the combination of ringing tones by a user being broadened to a frequency spectrum which is extended towards lower frequencies, which provides an improved ringing event.

In an electroacoustic apparatus in accordance with the invention it has proved to be very advantageous if, in addition, each fundamental tone signal generation means is adapted to generate at least one harmonic tone signal associated with the fundamental tone signal, while it has proved to be particularly advantageous if at least seven harmonic tone signals can be generated. The generation of harmonic tone signals and, consequently, of corresponding ringing tones makes it possible to generate a combination of ringing tones, which combination has the advantage that it is highly effectual to attract attention.

In the above context it has proved to be particularly advantageous if the additionally generated harmonic tone signal or the additionally generated harmonic tone signals have at least substantially the same amplitude as the associated fundamental tone signal. This makes it possible to realize a ringing tone combination which is experienced as very positive on account of its rich timbre.

The aforementioned aspects as well as further aspects of the invention will be apparent from the example of an embodiment described hereinafter and will be elucidated with the aid of this example.

The invention will be described in more detail hereinafter with reference to an embodiment which is shown in the drawing by way of example but to which the invention is not limited.

BRIEF DESCRIPTION OF THE DRAWING

FIG. 1 is a block diagram which in a highly schematic manner shows an electroacoustic apparatus embodying the invention.

DETAILED DESCRIPTION OF THE INVENTION

FIG. 1 shows an electroacoustic apparatus 1, which in the present case takes the form of a mobile telephone. The apparatus 1 has a signal processing circuit 2 and a microcomputer 3 as well as a power supply device 4, which includes rechargeable batteries, not shown, and which supplies a supply voltage V, which is supplied both to the signal processing circuit 2 and to the microcomputer 3 via a power supply input 5 and 6, respectively. The apparatus 1 includes further circuit elements but these circuit elements are not shown because they are not relevant in the present context.

The signal processing circuit 2 serves to process several signals. The signal processing circuit 2 has an antenna 7 and a microphone 8 as well as an electroacoustic transducer, i.e. a loudspeaker 9, connected to it. Text spoken during a telephone call is converted into a text signal TS1 with the aid of the microphone 8, which signal is subsequently applied to a first signal processing stage 10 of the signal processing circuit 2 and is processed by the first signal processing stage 10 so as to form a signal suitable for transmission. The signal supplied by the first signal processing stage 10 is applied to a first amplifier stage 11, which drives the antenna 7, as a result of which the relevant signal is transmitted. During a telephone call signals received with the aid of the antenna 7 are applied to a second signal processing stage 12, which processes the received signals and subsequently supplies the processed signals to a second amplifier stage 13, which subsequently supplies a second text signal TS2, which is applied to the loudspeaker 9 for acoustic reproduction.

The signal processing circuit 2 further includes a summing stage 14 and a third amplifier stage 15 arranged after the summing stage 14 and having an output 16 connected to the loudspeaker 9. The purpose of the summing stage 14 and of the third amplifier stage 15 will be described in detail hereinafter.

By means of the microcomputer 3 a series of means and functions are implemented but only those means which are relevant in the present case are described in greater detail.

With the aid of the microcomputer 3 ringing signal generation means 20 are realized, which are adapted to generate a ringing signal CS formed by a combination of constituent signals ES1, ES2, . . . Esn. The constituent signals ES1, ES2, . . . Esn generated with the aid of the ringing signal generation means 20 can be applied to the summing stage 14, which summing stage 14 forms the sum of the constituent signals applied to it and supplies the summed constituent signals as the ringing signal CS, which is amplified with the aid of the third amplifier stage 15 and is finally applied to the loudspeaker 9. The loudspeaker 9 acoustically reproduces the ringing signal CS applied to it as a combination of ringing tones CT1, CT2, . . . CTn produced by the constituent signals ES1, ES2, . . . Esn, as is shown symbolically by means of arrows in FIG. 1.

The ringing signal generation means 20 include a total number of n fundamental tone signal generation means GT1, GT2, . . . GTn. For example, a total number of six fundamental tone signal generation means may be provided. However, alternatively, more than six fundamental tone signal generation means or less than six fundamental tone signal generation means may be provided, for example two or three or five or seven or eight or nine or ten or more fundamental tone signal generation means. Each of the fundamental tone signal generation means GT1, GT2, . . . GTn is adapted to generate a fundamental tone signal GS1, GS2, . . . GSn of a given frequency f1, f2, . . . fn.

The ringing signal generation means 20 further include control means 21 which serve for controllably activating the fundamental tone signal generation means GT1, GT2, . . . GTn and with the aid of which each of the fundamental tone signal generation means GT1, GT2, . . . GTn can be activated for a given time interval T. In the present case each fundamental tone signal generation means GT1, GT2, . . . GTn can be activated for the same time interval T. However, this is not necessarily so because it is likewise possible to opt for an implementation in which the activation time interval differs for each of the fundamental tone signal generation means GT1, GT2, . . . GTn.

In the apparatus 1 the ringing signal generation means 20 are advantageously adapted to generate fundamental tone signals GS1, GS2, . . . GSn having frequencies F1, f2, . . . fn, which frequencies f1, f2, . . . fn bear a rational ratio to each other, for example a ratio of 4:5, 4:6, 4:7, 5:6, 5:7, 6:7, 6:9, 7:8, 7:9 or 8:9. Furthermore, the control means 21 in the apparatus 1 are advantageously realized in such a manner that the control means 21 provide a simultaneous activation of at least two fundamental tone signal generation means GT1, GT2, . . . GTn within a given time interval T. As already stated, the activation time intervals need not be equal but care must be taken that the activation time intervals overlap at least for a given minimum time interval because only then is it guaranteed that a number of fundamental tone signal generation means GT1, GT2, . . . GTn, determined by the control means 21, are activated simultaneously. With the aid of the control means 21 at least two fundamental tone signal generation means GT1, GT2, . . . GTn can be activated at consecutive intervals TX.

In the present case each of the fundamental tone signal generation means GT1, GT2, . . . GTn is adapted not only to generate a fundamental tone signal GS1, GS2, . . . GSn but, in addition, to generate a plurality of, i.e. seven, harmonic tone signals OS1', OS2", . . . OS1'"'"", OS2', OS2", . . . OS2'"'"", . . . OSn', OSn", . . . OSn'"'"", associated with the fundamental tone signals GS1, GS2, . . . GSn. Thus, in the present case the constituent signals ES1, ES2, . . . ESn are formed by fundamental tone signals GS1, GS2, . . . GSn and the harmonic tone signals associated with the fundamental tone signals, which harmonic tone signals each have a frequency which is an integral multiple of the frequency of the associated fundamental tone signal. Furthermore, it is to be noted that, in the present case, the harmonic tone signals OS1', OS2", . . . OS1'"'"", OS2', OS2", . . . OS2'"'"", . . . OSn', OSn", . . . OSn'"'"" suitably each have an amplitude which at least substantially corresponds to the amplitude of the associated fundamental tone signal GS1, GS2, . . . GSn.

By applying the constituent signals ES1, ES2, . . . Esn, which are formed by the fundamental tone signals and the harmonic tone signals superposed on the fundamental tone signals, to the loudspeaker 9 it is achieved that at consecutive time intervals TX each time at least two, but preferably more than two, fundamental tone signals together with the superposed harmonic tone signals are reproduced simultaneously, as a result of which during each acoustic reproduction of such a composite signal at least two, but preferably more than two, concurrent ringing signals CT1, CT2, . . . CTn result in a ringing event, during which ringing event a user also perceives subjective bass tones resulting from the illusionary perceptive faculty of the human ear and the human brain.

Hereinbefore, the invention is described with reference to a mobile telephone. It is to be noted that the measures in accordance with the invention can also be used advantageously in other electroacoustic apparatuses, for example desk-top telephones, pagers and a variety of other electroacoustic apparatuses requiring a ringing event consisting of a plurality of ringing tones. With regard to the fundamental tone signal generation means it is to be noted that the fundamental tone signal generation means need not be adapted to generate only seven harmonic tone signals associated with a fundamental tone signal but that, in addition to a fundamental tone signal, also two, three, four, five, six, seven, eight, nine, ten, eleven, twelve, thirteen and, if required, even more harmonic tone signals may be generated. Furthermore, it is to be noted that the amplitudes of the harmonic tone signals need not necessarily correspond substantially to the amplitude of the fundamental tone signal but that the amplitudes of the harmonic tone signals may alternatively be smaller and also greater than the amplitude of the associated fundamental tone signal. Moreover, it is to be noted that the harmonic tone signals associated with a fundamental tone signal need not necessarily all have the same amplitude but that the harmonic tone signals associated with a fundamental tone signal may alternatively have different amplitudes. Furthermore, it is to be noted that in the case of a variant of the apparatus whose specifications are somewhat less demanding, the fundamental tone signal generation means may also be adapted generate each time one fundamental tone signal, in which case the constituent signals each consist of only one fundamental tone signal.

What is claimed is:

1. An electroacoustic transducer (1)

having ringing signal generation means (20) for generating a ringing signal (CS) composed of a combination of constituent signals (ES1, ES2, . . . Esn), and having an electroacoustic transducer (9), to which the ringing signal (CS) can be applied and which reproduces the ringing signal (CS) as a combination of ringing tones (CT1, CT2, . . . CTn) produced by the constituent signals (ES1, ES2, . . . Esn), in which the ringing signal generation means (20) include at least two fundamental tone signal generation means (GT1, GT2, . . . GTn), which are each adapted to generate a fundamental tone signal (GS1, GS2, . . . GSn) of a given frequency (f1, f2, . . . fn), and in which the ringing signal generation means (20) further include control means (21) which serve for controllably activating the fundamental tone signal generation means (GT1, GT2, . . . GTn) and with the aid of which the fundamental tone signal generation means (GT1, GT2, . . . GTn) can be activated for a given time interval, and in which the fundamental tone signal generation means (GT1, GT2, . . . GTn) are adapted to generate fundamental tone signals (GS1, GS2, . . . GSn) of frequencies (f1, f2, . . . fn) which are in a rational ratio to each other, and in which the control means (21) are realized so as to cause a simultaneous activation of at least two fundamental tone signal generation means (GT1, GT2, . . . GTn) within a given time interval.

2. An apparatus (1) as claimed in claim 1, in which each fundamental tone signal generation means (GT1, GT2, . . . GTn) is adapted not only to generate a fundamental tone signal (GS1, GS2, . . . GSn) but, in addition, to generate at least one harmonic tone signal (OS1', OS2", . . . OS1""", OS2', OS2", . . . OS2""", . . . OSn', OSn", . . . OSn""") associated with the fundamental tone signal (GS1, GS2, . . . GSn).

3. An apparatus (1) as claimed in claim 2, in which each fundamental tone signal generation means (GT1, GT2, . . . GTn) is adapted, in addition, to generate at least seven harmonic tone signals associated with the fundamental tone signal.

4. An apparatus (1) as claimed in claim 2, in which each fundamental tone signal generation means (GT1, GT2, . . . GTn) is adapted, in addition, to generate at least one harmonic tone signal associated with the fundamental tone signal and having an amplitude which corresponds substantially to the amplitude of the fundamental tone signal.

5. An apparatus (1) as claimed in claim 3, in which each fundamental tone signal generation means (GT1, GT2, . . . GTn) is adapted, in addition, to generate at least seven harmonic tone signals associated with the fundamental tone signal and having an amplitude which corresponds substantially to the amplitude of the fundamental tone signal.

* * * * *